(12) United States Patent
Fechner et al.

(10) Patent No.: US 9,023,745 B2
(45) Date of Patent: May 5, 2015

(54) PHOTOVOLTAIC CELL HAVING A SUBSTRATE GLASS MADE OF ALUMINOSILICATE GLASS

(75) Inventors: Jörg Hinrich Fechner, Weiden (DE); Christof Kass, Tirschenreuth (DE); Franz Ott, Konnersreuth (DE)

(73) Assignee: Schott AG, Mainz (DE)

( * ) Notice: Subject to any disclaimer, the term of this patent is extended or adjusted under 35 U.S.C. 154(b) by 250 days.

(21) Appl. No.: 13/560,562

(22) Filed: Jul. 27, 2012

(65) Prior Publication Data

US 2012/0318356 A1 Dec. 20, 2012

Related U.S. Application Data

(63) Continuation of application No. PCT/EP2011/000192, filed on Jan. 18, 2011.

(30) Foreign Application Priority Data

Jan. 29, 2010 (DE) .......................... 10 2010 006 331

(51) Int. Cl.
C03C 3/087 (2006.01)
H01L 31/0392 (2006.01)
C03C 3/112 (2006.01)
C03C 3/118 (2006.01)

(52) U.S. Cl.
CPC .................. *C03C 3/112* (2013.01); *C03C 3/087* (2013.01); *C03C 3/118* (2013.01); *H01L 31/03923* (2013.01); *Y02E 10/541* (2013.01)

(58) Field of Classification Search
CPC ........ C03C 3/087; C03C 3/112; C03C 3/118; H01L 31/0392; Y02E 10/541; Y02E 10/52; Y02E 10/50
USPC ......... 501/57, 59, 70; 136/244, 251, 259, 252
See application file for complete search history.

(56) References Cited

U.S. PATENT DOCUMENTS

| | | | |
|---|---|---|---|
| 5,858,897 A | 1/1999 | Maeda et al. | |
| 5,958,812 A | 9/1999 | Koch et al. | |
| 7,325,417 B2 * | 2/2008 | Landa et al. | 65/29.16 |
| 8,455,375 B2 * | 6/2013 | Nishizawa et al. | 438/800 |
| 2005/0003136 A1 | 1/2005 | Kurachi et al. | |
| 2009/0197088 A1 * | 8/2009 | Murata | 428/410 |
| 2010/0137122 A1 * | 6/2010 | Nagai et al. | 501/70 |
| 2010/0326429 A1 | 12/2010 | Cumpston et al. | |
| 2011/0203645 A1 * | 8/2011 | Kuroki et al. | 136/252 |
| 2012/0121915 A2 * | 5/2012 | Cintora et al. | 428/426 |
| 2012/0199203 A1 * | 8/2012 | Nishizawa et al. | 136/262 |
| 2013/0059716 A1 * | 3/2013 | Fechner et al. | 501/14 |

FOREIGN PATENT DOCUMENTS

| | | |
|---|---|---|
| DE | 43 33 407 C1 | 11/1994 |
| EP | 0 769 481 A1 | 4/1997 |
| EP | 0 879 800 A1 | 11/1998 |
| EP | 2 346 085 A1 | 7/2011 |
| EP | 2 492 247 A1 | 8/2012 |
| JP | 57-129838 A | 8/1982 |
| JP | 7-101748 A | 4/1995 |
| JP | 11-135819 A | 5/1999 |
| JP | 2001031442 A | 2/2001 |
| JP | 2006-321680 A | 11/2006 |
| JP | 2006-321686 A | 11/2006 |
| JP | 2007059799 A | 3/2007 |
| WO | 94/07269 A1 | 3/1994 |
| WO | WO 2009054419 A1 * | 4/2009 |
| WO | WO 2009131053 A1 * | 10/2009 |
| WO | 2009/154314 A1 | 12/2009 |
| WO | WO 2010023419 A1 * | 3/2010 |
| WO | WO 2010050591 A1 * | 5/2010 |
| WO | 2011/035889 A1 | 3/2011 |
| WO | WO 2011049146 A1 * | 4/2011 |

OTHER PUBLICATIONS

Machine translation of JP 2001-031442 A, Feb. 6, 2001.*
International Search Report dated Jun. 1, 2011 for International Application No. PCT/EP2011/000192 (6 pages).
International Preliminary Report on Patentability and Written Opinion of the International Searching Authority dated Aug. 9, 2012 for International Application No. PCT/EP2011/000192 (11 pages).
Japanese Office Action dated Apr. 1, 2014 for Japanese Application No. 2012-550360 (4 pages).
European Office Action dated Feb. 24, 2014 for European Patent Application No. 11 702 137.8 (6 pages).
Japenense Office Action dated Dec. 24, 2014 for Japanese Patent Application No. 2012-550360 (3 pages).

* cited by examiner

Primary Examiner — Anthony J Green
Assistant Examiner — Elizabeth A Bolden
(74) Attorney, Agent, or Firm — Taylor IP, P.C.

(57) ABSTRACT

A photovoltaic cell, for example a thin-film photovoltaic cell, having a substrate glass made of aluminosilicate glass, has a glass composition which has $SiO_2$ and $Al_2O_3$ as well as the alkali metal oxide $Na_2O$ and the alkaline earth oxides CaO, MgO, and BaO, and optionally further components. The glass composition includes 10 to 16 wt.-% $Na_2O$, >0 to <5 wt.-% CaO, and >1 to 10 wt.-% BaO, and the ratio of CaO:MgO is in the range of 0.5 to 1.7. The aluminosilicate glass used is crystallization stable because of the selected quotient of CaO/MgO and has a transformation temperature >580° C. and a processing temperature <1200° C. Therefore, it represents a more thermally stable alternative to soda-lime glass. The aluminosilicate glass is used as a substrate glass, superstrate glass, and/or cover glass for a photovoltaic cells, for example for thin-film photovoltaic cells, in particular those based on semiconductor composite material, such as CdTe, CIS, or CIGS.

14 Claims, No Drawings

PHOTOVOLTAIC CELL HAVING A SUBSTRATE GLASS MADE OF ALUMINOSILICATE GLASS

CROSS REFERENCE TO RELATED APPLICATIONS

This is a continuation of PCT Application No. PCT/EP2011/000192, entitled "PHOTOVOLTAIC CELL HAVING A SUBSTRATE GLASS MADE OF ALUMINOSILICATE GLASS", filed Jan. 18, 2011, which is incorporated herein by reference.

BACKGROUND OF THE INVENTION

1. Field of the Invention

The present invention relates to a photovoltaic cell including a substrate glass made of aluminosilicate glass having high thermal resistance, low processing temperature, and high crystallization resistance.

2. Description of the Related Art

Soda-lime glass, also referred to as alkaline-earth-silicate glass, is among the oldest known glass types and is the most frequently used type of glass with respect to quantity ("normal glass"). It is used in many fields, for example as plate glass, such as mirror or window glass, as packaging glass, for example, for bottles, food packages, and drinking glasses, or in automobile construction, as composite safety glass. Known soda-lime glasses have the disadvantage that they only have a relatively low thermal resistance, for example, having a transformation temperature ("Tg") in the range of approximately 490 to 530° C. The application of soda-lime glasses is significantly restricted in this way.

The properties of glass and the products produced therefrom must be specially adapted for many applications. Therefore, a need exists to vary and modify the known glass compositions in such a manner that the properties of the glasses are suitable for special applications. However, it is always problematic in this context that the reduction or increase of the proportion of one component can trigger a plurality of effects which act differently on the glass properties. The procedures and effects in the event of replacement or modification of multiple components in a glass composition are still more complex, the individual glass components mutually influencing one another, so that simple relationships are typically not predictable. It is therefore relatively difficult to provide custom-tailored glass compositions for special applications.

There are numerous publications in the prior art which are concerned with glasses according to the species. For example, JP 07-101748 A describes low-aluminum, alkaline glasses for plasma display panels, the glass composition being synthesized from 0.3-2.5 weight percent (wt.-%) $Li_2O$, 7.0-12 wt.-% $Na_2O$, 1.5-4.5 wt.-% $K_2O$, 0-5.0 wt.-% MgO, 6.0-9.0 wt.-% CaO, 0-5.0 wt.-% SrO, 3.5-15.0 wt.-% BaO, 2.0-4.5 wt.-% $Al_2O_3$, 57.0-68.0 wt.-% $SiO_2$, 0-5.0 wt.-% $ZrO_2$, and 0-0.5 wt.-% $CeO_2$, the sum of $Li_2O+Na_2O+K_2O$ being 9.0-16.0 wt.-%.

U.S. Pat. No. 5,858,897 describes a glass composition for a substrate, which is suitable in particular for a flat display, preferably a plasma display panel (PDP). The glass composition essentially comprises: 59-72 wt.-% $SiO_2$, 1-15 wt.-% $Al_2O_3$, 0.5-9 wt.-% MgO, 0.5-11 wt.-% CaO, 0-6 wt.-% SrO, 0-5 wt.-% BaO, 4-19 wt.-% MgO+CaO+SrO+BaO, 0-9 wt.-% $Na_2O$, 4-21 wt.-% $K_2O$, 10-22 wt.-% $Na_2O+K_2O$, and 0.5-10.5 wt.-% $ZrO_2$, the difference between the $SiO_2$ content and the $Al_2O_3$ content being 50 to 71 wt.-% and the relative density being less than 2.6.

Furthermore, EP 0 769 481 A1 discloses a glass composition for a substrate, in particular for plasma displays, the glass composition comprising: 52-62 wt.-% $SiO_2$, 5-12 wt.-% $Al_2O_3$, 0-4 wt.-% MgO, 3-5.5 wt.-% CaO, 6-9 wt.-% SrO, 0-13 wt.-% BaO, 17-27 wt.-% MgO+CaO+SrO+BaO, 7-14 wt.-% $Li_2O+Na_2O+K_2O$, 0.2-6 wt.-% $ZrO_2$, and 0-0.6 wt.-% $SO_3$. Such a high SrO proportion in the glass composition has great disadvantages, however. SrO is a relatively costly material, so that the production of the glass becomes significantly more expensive. The advantages asserted in EP 0 769 481 A1, that the transformation temperature is to significantly increase and the thermal coefficient of expansion is to rise, could not be reproduced according to the present invention. Rather, an elevated SrO content does not display any positive influence on the properties and effects for the areas of application according to the present invention; SrO is therefore not provided in the high quantities described here according to the present invention.

Furthermore, EP 0 879 800 A1 describes solarization-stable aluminosilicate glasses, which are suitable for use in display technology, in particular for plasma display panels, and have the following composition:
$SiO_2$ 45-68 wt.-%;
$Al_2O_3$ >5-18 wt.-%;
$Na_2O$ 0-5 wt.-%;
$K_2O$ >9-15 wt.-%;
$Na_2O+K_2O$ ≥10 wt.-%;
CaO 0-10 wt.-%;
SrO 0.5-18 wt.-%;
BaO 0-10 wt.-%;
CaO+SrO+BaO 8-<17 wt.-%;
$ZrO_2$ 1-6 wt.-%; and
$TiO_2$ 0.2-5 wt.-%.

U.S. Pat. No. 5,958,812 A relates to thermally stable glass compositions, which comprise:
$SiO_2$ 45-68 wt.-%;
$Al_2O_3$ 0-20 wt.-%;
$ZrO_2$ 0-20 wt.-%;
$B_2O_3$ 0-10 wt.-%;
$Na_2O$ 2-12 wt.-%;
$K_2O$ 3.5-9 wt.-%;
CaO 1-13 wt.-%;
MgO 0-8 wt.-%;
the sum of $SiO_2+Al_2O_3+ZrO_2$≤70 wt.-%, the sum of $Al_2O_3+ZrO_2$≥2 wt.-%, and the sum of $Na_2O+K_2O$≥8 wt.-%, and if desired, the oxides BaO and/or SrO being provided in quantities such that: 11 wt.-%≤MgO+CaO−BaO+SrO>30 wt.-%. The glass compositions are used for the production of fire-resistant window panes, in particular plasma shields, electroluminescence shields, and cold cathode shields (field emission displays).

Furthermore, US 2005/0003136 A1 discloses a glass composition which obtains a higher strength through chemical treatment. The glass composition comprises:
$SiO_2$ 59-68 wt.-%;
$Al_2O_3$ 9.5-15 wt.-%;
$Li_2O$ 0-1 wt.-%;
$Na_2O$ 3-18 wt.-%;
$K_2O$ 0-3.5 wt.-%;
MgO 0-15 wt.-%;
CaO 0-15 wt.-%;
SrO 0-4.5 wt.-%;
BaO 0-1 wt.-%;
$TiO_2$ 0-2 wt.-%; and
$ZrO_2$ 1-10 wt.-%.
The glass composition is used, for example, as a glass substrate for a magnetic recording medium.

Furthermore, aluminosilicate glasses having a high thermal resistance and low processing temperature are known from WO 2011/035889 A1 (DE 10 2009 042 796.1), filed on Sep. 25, 2009. Experiments have shown that the glasses do have the required physical properties, but in specific cases do not display satisfactory results with respect to the crystallization resistance.

In particular with respect to renewable or regenerating energy, i.e., energy from sources which either renew themselves in a short time or whose usage does not contribute to the exhaustion of the source, novel and improved possible uses of glasses are increasingly significant. The limited resources of fossil energy carriers, the need for environmental and climate protection, and the efforts for lower dependence on energy exporters or overall for a more sustainable energy provision require targeted refinements of the existing technologies. For these available sustainable energy resources, such as solar radiation (solar energy), very special requirements on the glasses to be used must additionally be considered.

A demand therefore exists to provide glasses which do not display the disadvantages of the prior art, are modified with respect to their properties, and may be used in particular in the field of converting solar energy into electrical current (photovoltaics).

Accordingly, what is needed in the art is an alternative to soda-lime glasses which avoids the disadvantages of the prior art, has a higher thermal carrying capacity (Tg) in comparison to soda-lime glasses, but nonetheless has the lowest possible processing temperatures (VA), and does not tend toward crystallization and is used in photovoltaics.

SUMMARY OF THE INVENTION

The present invention provides a photovoltaic cell, for example a thin-film photovoltaic cell, including a substrate made of aluminosilicate glass, the aluminosilicate glass having a glass composition which has $SiO_2$ and $Al_2O_3$ as well as the alkali metal oxide $Na_2O$ and the alkaline earth oxides CaO, MgO, and BaO, and optionally further components. The glass composition includes 10 to 16 wt.-% $Na_2O$, for example >10 to 14 wt.-%, or >10 to 13 wt.-%, >0 to <5 wt.-% CaO, for example 0.1 to 4.9 wt.-%, 1 to 4.7 wt.-%, 3 to 4.7 wt.-%, or approximately 3 to <4.5 wt.-%, and >1 to 10 wt.-% BaO, for example 1.1 to 10 wt.-%, 1.25 to 10 wt.-%, 1.5 to 10 wt.-%, or 1.75 to 10 wt.-%, and the ratio (wt.-%) of CaO:MgO is in the range of 0.5 to 1.7.

The present invention also provides a method for the use of an aluminosilicate glass as a substrate glass, superstrate glass, and/or cover glass for photovoltaic cells, for example thin-film photovoltaic cells, in particular those based on composite semiconductor material, such as Cadmium Tellurium (CdTe), Copper Indium Selenide (CIS), or Copper Indium Gallium Selenide and/or Sulfide (CIGS). The aluminosilicate glass has a glass composition which has $SiO_2$ and $Al_2O_3$ as well as the alkali metal oxide $Na_2O$ and the alkaline earth oxides CaO, MgO, and BaO, and optionally further components. The glass composition includes 10 to 16 wt.-% Na2O, for example >10 to 14 wt.-%, or >10 to 13 wt.-%, >0 to <5 wt.-% CaO, for example 0.1 to 4.9 wt.-%, 1 to 4.7 wt.-%, 3 to 4.7 wt.-%, or 3 to <4.5 wt.-%, and >1 to 10 wt.-% BaO, for example 1.1 to 10 wt.-%, 1.25 to 10 wt.-%, 1.5 to 10 wt.-%, or 1.75 to 10 wt.-%, and the ratio (wt.-%) of CaO:MgO is in the range of 0.5 to 1.7.

According to an embodiment of the present invention, an aluminosilicate glass is provided or used as a substrate, in particular as a substrate glass, superstrate glass, and/or cover glass of a photovoltaic cell, for example a thin-film photovoltaic cell, which has the following glass composition (in wt.-% on an oxide basis):
$SiO_2$ 49-69 wt.-%;
$B_2O_3$ 0-2 wt.-%;
for example $B_2O_3$ 0 wt.-%;
$Al_2O_3$ >4.7-15 wt.-%;
for example $Al_2O_3$ >9-15.5 wt.-%;
or $Al_2O_3$ >11-15.5 wt.-%;
$Li_2O$ 0-4 wt.-%;
for example $Li_2O$ 0-<0.3 wt.-%;
$Na_2O$ 10-16 wt.-%;
$K_2O$ >0-8 wt.-%;
for example $K_2O$ >0-<5 wt.-%;
or $K_2O$ >2-<5 wt.-%;
the sum of $Li_2O+Na_2O+K_2O$ being >12-19 wt.-%;
MgO >0-6 wt.-%;
for example MgO >2-5.5 wt.-%;
CaO >0-<5 wt.-%;
for example CaO 2-<5 wt.-%;
SrO 0-8 wt.-%;
for example SrO 0-5 wt.-%;
or SrO 0-<3 wt.-%;
or SrO 0-<0.5 wt.-%;
BaO >1-10 wt.-%;
for example BaO 1.1-9 wt.-%;
or BaO 2-8.5 wt.-%;
F 0-3 wt.-%;
for example F >0-0.3 wt.-%;
$TiO_2$ 0-6 wt.-%;
for example $TiO_2$ >0.1-5 wt.-%;
$Fe_2O_3$ 0-0.5 wt.-%;
$ZrO_2$ >0-6 wt.-%;
or $ZrO_2$ 1.5-5 wt.-%;
the sum of $BaO+ZrO_2$ being 4-15 wt.-%;
or the sum of $BaO+ZrO_2$ being 5-15 wt.-%;
ZnO 0-5 wt.-%;
for example ZnO 0.5-3 wt.-%;
$CeO_2$ 0-2 wt.-%;
$WO_3$ 0-3 wt.-%;
$Bi_2O_3$ 0-3 wt.-%;
$MoO_3$ 0-3 wt.-%; and
the ratio (wt.-%) of CaO:MgO being in the range of 0.5 to 1.7. Typical refining agents, such as sulfates, chlorides, $Sb_2O_3$, $As_2O_3$, $SnO_2$ may be added to the above glass/the glass melt.

The composition of the aluminosilicate glass used according to the present invention is, for example, in the range:
$SiO_2$ 48-58 wt.-%;
$B_2O_3$ 0-1 wt.-%;
for example $B_2O_3$ 0 wt.-%;
$Al_2O_3$ 12-16 wt.-%;
for example $Al_2O_3$ >12-15 wt.-%;
$Li_2O$ 0-1 wt.-%;
for example $Li_2O$ 0-<0.3 wt.-%;
$Na_2O$ 10-14 wt.-%;
$K_2O$ 1-5 wt.-%;
for example $K_2O$ 2-4 wt.-%;
the sum of $Li_2O+Na_2O+K_2O$ being 11-17 wt.-%;
MgO 1.5-6 wt.-%;
CaO 3-4.5 wt.-%;
for example CaO 3-<4.5 wt.-%;
SrO 0-3 wt.-%;
for example SrO 0-<0.5 wt.-%;
BaO 3-10 wt.-%;
for example BaO 4-9.5 wt.-%;
or BaO 5-8.5 wt.-%;

the sum of MgO+CaO+SrO+BaO being 7-18 wt.-%;
for example the sum of MgO+CaO+SrO+BaO being 12-17 wt.-%;
F 0-3 wt.-%;
for example F >0-1 wt.-%;
$TiO_2$ 0-3 wt.-%;
for example $TiO_2$ 0-2 wt.-%;
or $TiO_2$ 0-1 wt.-%;
$Fe_2O_3$ 0-0.5 wt.-%;
$ZrO_2$ >0-7 wt.-%;
for example $ZrO_2$ 1-6 wt.-%;
or $ZrO_2$ 1.5-6 wt.-%;
the sum of $BaO+ZrO_2$ being 8-15 wt.-%;
or the sum of BaO+ZrO2 being 10-15 wt.-%;
or the sum of BaO+ZrO2 being 8-13 wt.-%;
ZnO 0-5 wt.-%;
for example ZnO 0.5-2 wt.-%;
$CeO_2$ 0-2 wt.-%;
$WO_3$ 0-3 wt.-%;
$Bi_2O_3$ 0-3 wt.-%;
$MoO_3$ 0-3 wt.-%; and
the ratio (wt.-%) of CaO:MgO being in the range of 0.5 to 1.7.

Typical refining agents, such as sulfates, chlorides, $Sb_2O_3$, $As_2O_3$, $SnO_2$ may be added to the above glass/the glass melt.

The present invention accordingly provides an aluminosilicate glass developed for very special applications, which is suitable in particular for use in a photovoltaic cell, for example a thin-film photovoltaic cell. The aluminosilicate glass can be used as an alternative for a soda-lime glass, a significantly higher transformation temperature Tg>580° C., for example >600° C. being achieved than soda-lime glasses. The transformation temperature Tg of the aluminosilicate glass according to the present invention is in the range of approximately 590° C. to 625° C., for example. Simultaneously, a lower processing temperature is obtained for aluminosilicate glasses ("VA")<1200° C., for example <1150° C. Thus, for example, processing temperatures according to the present invention are in the range of approximately 1100° C. to approximately 1170° C., for example. In addition, the thermal expansion which is characteristic for soda-lime glasses, of approximately 8.5 to $10 \times 10^{-6}$/K (coefficient of thermal expansion), is achieved in the temperature range of 20 to 300° C. by the glasses used according to the present invention.

To obtain these characteristic properties, for example a high transformation temperature Tg and a low processing temperature as well as a high expansion, the glass has high contents of $Na_2O$ of 10 wt.-%, for example >11 wt.-%, the upper limit being ≤16 wt.-%. For the very special applications of the glasses according to the present invention as substrate glasses, for example, as CIGS substrate glasses (copper-indium-gallium sulfide and/or selenide) and CdTe substrate glasses (cadmium tellurium) for photovoltaics, a $Na_2O$ content of ≥10 wt.-% is an essential feature. Sodium provides a significant contribution in this case to increasing the efficiency, in that sodium ions may diffuse into the CIGS or CdTe layer. The high sodium content therefore decisively contributes to the fact that the high Tg value according to the present invention is achieved simultaneously with a low processing temperature and high expansion of the aluminosilicate glass used according to the present invention.

Furthermore, it is significant in the scope of the present invention that in the glass used, the contents of CaO are in the range of >0 wt.-% to <5 wt.-%. The CaO content is, for example, <4.9 wt.-%, <4.7 wt.-%, <4.5 wt.-%, <4.3 wt.-%, or <4.0 wt.-%. The lower limit on CaO is >0 wt.-%, for example 0.1 wt.-%, or the lower limit is >0.5 or 1.0 wt.-%, such as >2 wt.-%, to set the described physical properties and a sufficient crystallization resistance of the glasses. CaO may therefore be provided in the aluminosilicate glass used according to the present invention in a quantity of 0.1 to 4.9 wt.-%, or in a quantity of 1 to <4.7 wt.-%, such as in a quantity of 3 to 4.7 wt.-%, in a quantity of 3 to <4.5 wt.-%, or in a quantity of 3 to <4.3 wt.-%.

The desired properties of the glass may be implemented to a particularly high degree if the quotient (wt.-%) of CaO/MgO is set in the range of 0.5 to 1.7, for example in the range of 0.8 to 1.6, or in the range of 1.1 to 1.55. To determine the quotient, the quantity of CaO in wt.-% is divided by the quantity of MgO in wt.-% and a numeric value without units is obtained, which is to be in the range claimed according to the present invention. By setting the quotient (wt.-%) of CaO/MgO in the described range, the crystallization resistance can be increased, the described physical properties being achieved simultaneously.

According to the present invention, if aluminosilicate glasses are selected, the sum of MgO+CaO+SrO+BaO may, for example, be in the range of 7 to 18 wt.-%, 7 to 17 wt.-%, or 10 to 16 wt.-%. This can also contribute to providing the desired physical properties of the glasses to a high degree.

Therefore, aluminosilicate glasses are used according to the invention. As the main components, these include $SiO_2$ and $Al_2O_3$ as well as the alkaline oxide $Na_2O$ and the alkaline earth oxides CaO and MgO and optionally further components.

The basic glass typically includes at least 48 wt.-%, for example at least 49 wt.-%, or at least 50 wt.-% $SiO_2$. The highest quantity of $SiO_2$ is 69 wt.-% $SiO_2$, for example 64 wt.-%, or 60 wt.-%. A possible range of the $SiO_2$ content is 50 to 60 wt.-%, or 52 to 58 wt.-%.

The quantity of $Al_2O_3$ is for example >4.7 wt.-%, >5 wt.-%, >7 wt.-%, >9 wt.-%, or ≥11 wt.-%. The $Al_2O_3$ content is, for example, ≤16 wt.-%, ≤15 wt.-%, or ≤14.5 wt.-%, in order to allow good fusibility. Ranges of >5 to 16 wt.-% or 11 to 15 wt.-% are also possibilities. The content can be varied as a function of the intended use. Exceeding the $Al_2O_3$ content of 16 wt.-% has the disadvantage of worsened fusibility. Falling below the $Al_2O_3$ content of 4.7 wt.-% has the disadvantage that the chemical resistance of the glass is worsened and the tendency toward crystallization increases.

Of the oxides of the alkaline metals lithium, sodium, and potassium, as already noted, sodium oxide is of substantial significance in particular. $Na_2O$ is included according to the present invention in a quantity of ≥10 to 16 wt.-%, for example in a quantity of >10 to 15 wt.-%, in a quantity of 10 to 14 wt.-%, in a quantity of 10 to 13 wt.-%, or in a quantity of >11 to 13 wt.-%. The content according to the present invention of $K_2O$ is, for example, >0 to 8 wt.-%, >0 to <5 wt.-%, or >2 to <5 wt.-%. According to the present invention, the $Li_2O$ content is, for example, 0 to 4 wt.-%, 0 to 1.5 wt.-%, or 0 to <0.3 wt.-%. The addition of $Li_2O$ can be used to set the thermal coefficient of expansion (CTE) and to reduce the processing temperature. However, the $Li_2O$ content may be <0.3 wt.-% or the glass is completely free of $Li_2O$. Up to this point, there have been no indications that $Li_2O$ would act similarly to $Na_2O$, since its diffusion is presumably too high. In addition, $Li_2O$ is costly as a raw material, so that it is advantageous to use smaller quantities or to leave it out entirely ($Li_2O$=0 wt.-%).

Exceeding the respective specified alkaline oxide content has the disadvantage that the corrosion of an existing glass contact material worsens. Falling below the respective alkaline oxide content has the disadvantage that the fusibility is worsened. The sum of $Li_2O+Na_2O+K_2O$ is, for example, in the range >11 to 19 wt.-%, or in the range >12 to 17 wt.-%. The oxides of calcium, magnesium, optionally barium, and, to a lesser extent, also strontium are used as alkaline earth oxides.

CaO is provided in the glass composition according to the present invention in the range of >0 to <5 wt.-%, for example in the range of 0.1 to 4.9 wt.-%, in the range of 1 to 4.7 wt.-%, 2 to 4.7 wt.-%, in the range of 3 to 4.7 wt.-%, in the range of 3 to <4.5 wt.-%, or in the range of 3 to <4.3 wt.-%.

MgO is, for example, used in the range of >0 to 6 wt.-%, in the range of 0.1 to 6 wt.-%, in the range of 1.5 to 6 wt.-%, in the range of 1.5 to 5.5 wt.-%, or in the range of 2 to 5.5 wt.-%. In order to achieve the described properties of the aluminosilicate glasses of the present invention, the quantities of CaO and MgO, each in wt.-%, are selected in the described ranges in such a manner that the quotient CaO:MgO is set in the range of 0.5 to 1.7, in the range of 0.8 to 1.6, or in the range of 1.1 to 1.55. By setting the quotient (wt.-%) of CaO:MgO in the described range, the crystallization stability is increased and the described physical properties are achieved to the desired extent.

In the scope of the present invention, a quantity specification of >X wt.-% for a component in the glass composition means that it contains more than X wt.-%. For example, >0 wt.-% of a component means that it contains a quantity of more than 0 wt.-%, for example, a quantity of 0.1 wt.-% or more. In the scope of the invention, a quantity specification of <Y wt.-% for a component in the glass composition means that it contains less than Y wt.-%. For example, <5 wt.-% of a component means that it contains a quantity of less than 5 wt.-%, for example, a quantity of 4.9 wt.-% or less.

BaO is used in the present invention in the range of >1 to 10 wt.-%, for example in the range of 1.1 to 10 wt.-%, in the range of 1.25 to 10 wt.-%, in the range of 1.5 to 10 wt.-%, or in the range of 1.75 to 10 wt.-%. Furthermore, ranges of >1 to 9 wt.-%, 2 to 9 wt.-%, 2 to 8.5 wt.-% are, for example, used. The advantage of a greater BaO content is that it can be used to increase the transformation temperature Tg of the glass composition. The advantages of a small BaO content are essentially the lower density and therefore a weight reduction of the glass, as well as the savings in cost of the expensive components per se. According to the present invention, a BaO content in the range of >1 to 10 wt.-% is used. The low density is advantageous in particular during the transport of the glasses for further processing, in particular if the products produced from the glass are to be installed in portable devices. A very particular advantage of a low density and therefore a lower weight of a substrate glass for photovoltaic applications, for example, is that modules/panels in which the glass according to the present invention is used, for example, may be constructed on foundations (e.g., industrial flat roofs) which only have a small ultimate load. This can advantageously be achieved to a still higher extent, for example, in that BaO is replaced by SrO.

The $ZrO_2$ content may be set according to the present invention in the range of >0 to 7 wt.-%, for example 1 to 6 wt.-%, or in the range of 1.5 to 5 wt.-%.

The sum of $BaO+ZrO_2$ may be set in the range of 4 to 15 wt.-%, for example in the range of 5 to 15 wt.-%, in the range of 7 to 13 wt.-%, or in the range of 8 to 12.5 wt.-%. Setting the sum in the described range is advantageous since in this way the required physical properties, in particular the glass transformation temperature (Tg) and the processing temperature (VA), may be set and the addition of these components (together with MgO) makes it possible to reduce the CaO content and thus increase the crystallization stability.

SrO may be provided in the glass according to the present invention in the range of 0 to 8 wt.-%, for example 0 to <6 wt.-%, 0 to 5 wt.-%, 0 to <3.5 wt.-%, or in the range of 0 to <0.5 wt.-%. SrO is generally used to increase the transformation temperature Tg of the glass. However, SrO can also be entirely absent in the glass composition according to the present invention (SrO=0 wt.-%). Particularly disadvantageous effects, as are asserted in the prior art, could not be established in this way.

According to the present invention, the sum of MgO+CaO+SrO+BaO is in the range of 7 to 18 wt.-%, for example in the range of 7 to 17 wt.-%, in the range of 9 to 16 wt.-%, or in the range of 12 to 16 wt.-%.

According to the present invention, $B_2O_3$ may be provided in a quantity of 0 to 2 wt.-%, for example 0 to 1 wt.-%, or 0 to 0.5 wt.-%. According to an embodiment, the glass is free of $B_2O_3$. This may be advantageous since $B_2O_3$ is of toxicological concern (teratogenic), on the one hand and is an expensive component, on the other hand, which significantly increases the quantity price. In addition, higher proportions of $B_2O_3$ have the disadvantage that they vaporize during the glass fusion, precipitate in an interfering manner in the exhaust gas area, and change the glass composition per se. Furthermore, the addition of $B_2O_3$ is disadvantageous in special applications. Thus, it has been shown that a $B_2O_3$ content greater than 1 wt.-% in a substrate glass has a disadvantageous effect on the efficiency of a thin-film solar cell, since boron atoms from the substrate glass reach the semiconductor layers via evaporation or diffusion, where they possibly cause effects, which are electrically active and could reduce the performance of the cell through increased recombination.

Furthermore, ZnO may be included in a quantity of 0 to 5 wt.-%, for example in a quantity of 0.5 to 3 wt.-%. According to one embodiment of the present invention, a ZnO content of 0.5 to 2.0 wt.-%, for example 0.7 to 1.5 wt.-%, is present. In addition, other components, such as $Wo_3$, $MoO_3$, $Bi_2O_3$, $CeO_2$, $TiO_2$, $Fe_2O_3$, and/or F or also further components may also be provided independently of one another in the aluminosilicate glass according to the present invention. $Wo_3$, $MoO_3$, $Bi_2O_3$ may each be provided independently of one another in the aluminosilicate glasses according to the present invention in a quantity of 0 to 3 wt.-%, for example 0 to 1 wt.-%. These components may be used to set the UV edge of the glass and may also be used as redox buffers during the refining.

$TiO_2$ and also $CeO_2$ may typically be added for UV blocking of the glass. Depending on the area of application, the glass used according to the present invention may be provided in the form of a cover glass or envelope tube, for example, and have doping using, for example, $TiO_2$ and/or $CeO_2$, in order to keep harmful UV radiation away from components below the glass. The $TiO_2$ content is, for example, in the range of 0 to 6 wt.-% according to the present invention. In the range of >0.1 to 5 wt.-%, or in the range of >0.1 to 3 wt.-%. According to the present invention, $CeO_2$ may be provided in a range of 0 to 2 wt.-%, for example 0 to 1 wt.-% or 0.1 to 0.5 wt.-%. If $CeO_2$ is added to the glass, $SnO_2$ may be added to the glass in corresponding quantities in order to prevent coloration of the glass.

$Fe_2O_3$ is, for example, used in a quantity of 0 to 0.5 wt.-% and is typically used to set the UV blocking, but can also be used as a redox buffer for the refining.

Furthermore, fluorine can be added to the glass of the present invention in the form of fluoride salts, such as NaF, to improve the fusibility. The quantity which is used in the glass composition is, for example, 0 to 3 wt.-%, or 0 to 1 wt.-%. The glass may contain F in a concentration of 0.05 to 0.2 wt.-%.

The aluminosilicate glasses used according to the present invention are to be free of niobium oxide except for unavoidable contaminants, in contrast to the prior art according to U.S. Pat. No. 5,434,111.

Typical refining agents may be used, if they do not disadvantageously influence the chemical and physical properties of the glass composition used according to the present invention. For example, refining using sulfates, chlorides, $Sb_2O_3$, $As_2O_3$, and/or $SnO_2$ is possible. The refining agents are each included per se in the glass in a quantity of, for example, >0 to 1 wt.-%, the minimum content being 0.05, or 0.1 wt.-%.

The aluminosilicate glass employed according to the present invention can be used in any arbitrary shape, for example, as flat glass, tubular glass, block glass, fiberglass, bar glass, for example, round, oval, structured or non-structured; however, tubular glasses may be utilized with respect to the field of photovoltaics.

The aluminosilicate glasses in the scope of the present invention are suitable, for example, for producing plate glass, for example according to the float method. In addition, the aluminosilicate glasses are suitable for producing tubular glass, the Danner method being an optimal method of production. However, the production of tubular glass according to the Vello or A-traction method is also possible. Glass tubes may also be produced which have a diameter of at least 5 millimeters (mm) to at most 15 centimeters (cm). Tube diameters may, for example, be between 1 cm and 5 cm, or 1 cm and 3 cm, with wall thicknesses of, for example, at least 0.5 mm to at most 3 mm, or 0.8 mm to 2 mm.

The use according to the present invention of the aluminosilicate glasses, in particular as an alternative for soda-lime glasses, is based on the higher thermal resistance than these glasses.

The areas of application of the present invention are in the field of solar technology as substrate glasses for photovoltaic applications of all types, such as for technologies which do not operate on the basis of silicon, for example, CIS, CIGS, or CdTe.

The area of use for the aluminosilicate glasses provided according to the present invention are solar applications (photovoltaic applications), i.e., applications in which a glass having a high thermal expansion and relatively high temperature stability (processing stability) is required, but the hot shaping of the glass can be performed at the lowest possible temperatures (a so-called "short glass"). The processing temperature (VA) of the glass is to be as low as possible to allow cost-effective production of these glasses. The processing temperature (VA) in the present application is the temperature at which the glass has a viscosity $\eta$ of $\eta=10^4$ decipascals (dPa). Depending on the glass composition, the processing temperature VA, at which a viscosity $\eta=10^4$ dPa is reached, can vary. The aluminosilicate glasses used according to the present invention fulfill these requirements to a high degree, since they provide processing temperatures <1200° C. and are therefore particularly well suitable for such applications.

The aluminosilicate glasses used according to the present invention are suitable as substrate/superstrate glasses or also as cover glasses in photovoltaic cells, such as for thin-film photovoltaic cells, including layers containing cadmium and/or tellurium in metal form or containing copper, indium, gallium, sulfur, and/or selenium in metal form. Superstrates are substrate glasses, the substrate glasses functioning as a quasi-cover glass, since the coated glass is "inverted" in thin-film photovoltaics and the layer lies on the bottom side and the light is incident on the photovoltaic layer through the substrate glass.

The aluminosilicate glasses according to the present invention are therefore suitable for technologies based on CdTe, as well as technologies which are based on copper-indium-gallium-sulfide-selenide, so-called CIS or CIGS. CIGS stands for $Cu(In_{1-x},Ga_x)(S_{1-y},Se_y)_2$ and is a known thin-film technology for solar cells and stands as an abbreviation for the employed elements copper, indium, gallium, sulfur, and selenium. Important examples are $Cu(In,Ga)Se_2$ (copper-indium-gallium-diselenide) or $CuInS_2$ (copper-indium-disulfide). These materials are distinguished in particular in that they already effectively absorb the sunlight as direct semiconductors in a relatively thin layer of a few micrometers. The deposition of such thin photoactive layers requires high processing temperatures to achieve high efficiencies. Typical temperatures are in the range of 450 to 600° C., the maximum temperature being limited by the substrate. For large-area applications, glass is frequently used as the substrate, as is well known. In order that the coefficient of thermal expansion (CTE) is adapted to the semiconductor layers, up to this point float soda-lime glass has been used as the substrate, for example, as disclosed in DE 43 33 407 and WO 94/07269. Soda-lime glass has a transformation temperature of approximately 525° C., as already explained, however, and therefore limits all processing processes to approximately 500° C. Otherwise, so-called bulges occur and the glass begins to sag. This is all the more true the larger the substrate to be coated and the closer the processing temperature approaches the transformation temperature Tg of the glass. Bulges and sags of the substrate result in problems in particular in in-line processes or plants, whereby the throughput and the yield drop dramatically.

The aluminosilicate glasses used according to the present invention therefore represent an alternative to soda-lime glasses in this area of use in particular and may advantageously replace them, since higher method temperatures may be used in the vapor deposition of semiconductor layers than in the case of typical soda-lime glasses, without the substrate disadvantageously deforming. A desired higher temperature during the coating method additionally results in higher deposition rates and very good crystalline quality of the created layers.

In order that chipping of the layers does not occur during the cooling after the application of the semiconductor layers, it is necessary for the substrate glass to further be adapted to the coefficient of thermal expansion of the semiconductors applied thereon (e.g., approximately $8.5 \times 10^{-6}$/K for CIGS). The thermal adaptation to the CIGS layer is decisive in this case, and not, as one could assume, to that of the back contact material, such as molybdenum, since it can absorb a greater CTE difference because of the ductility. However, the CTE should also not be too low for the molybdenum layer (not less than approximately $4 \times 10^{-6}$/K), since otherwise chipping of the layer occurs. These properties are also provided by the aluminosilicate glasses selected according to the present invention.

The aluminosilicate glasses according to the present invention are therefore used in the field of solar technology, for photovoltaic cells, such as thin-film photovoltaic cells, in particular those based on composite semiconductor material, such as CdTe, CIS, or CIGS. The glasses of the present invention are therefore used as thin-film photovoltaic cell substrate or super substrates or cover glasses. Substantially less photoactive material is required in this case for an efficient conversion of sunlight into electricity than in the case of typical crystalline silicon-based photovoltaic cells. The small semiconductor consumption and the high degree of automation of the manufacturing result in significant cost reductions with this technology.

A further advantage upon use of the aluminosilicate glasses according to the present invention in photovoltaic technology is their high content of sodium. It is known that sodium can be incorporated in a semiconductor and thus increase the efficiency of a solar cell through improved chalcogen incorporation in the crystal structure of the semiconductor. The substrate glass can thus also be used, in addition to the property as a carrier, for the targeted discharge of sodium ions/atoms into the semiconductor.

The aluminosilicate glasses used according to the present invention are very particularly well suited for the above-mentioned technologies, since the processing capability and deposition of semiconductor layers can be performed at higher temperatures than the traditionally used soda-lime glasses because of higher temperature stability, which results in significant advantages. A criterion for this purpose is the so-called transformation temperature Tg. On the other hand, particularly high temperatures are not required for the melting and hot shaping process of the aluminosilicate glass according to the present invention, which allows cost-effective production.

According to an embodiment of the present invention, the substrate of the photovoltaic cell is provided in the form of a tubular glass. According to a further embodiment according to the present invention, the substrate of the photovoltaic cell is implemented in the form of an inner tube and is enclosed by a protective tube in the form of an outer tube, the inner tube and optionally also the outer tube containing or consisting of the aluminosilicate glass, which has already been explained in detail.

The present invention is explained in greater detail hereafter on the basis of examples, which are to illustrate the teaching according to the present invention, but are not to restrict it.

EXAMPLES

In the scope of the teaching according to the present invention, glass compositions were selected and, for example, 1 to 16 and glasses were produced therefrom. For this purpose, 1 L platinum crucibles were used for the melting, into which the raw materials were brought to a melting temperature of approximately 1580° C. over 3 hours and held and stirred for 4 hours at this temperature therein. Subsequently, the melt was poured into graphite molds preheated to approximately 500° C. The casting mold was placed in a cooling furnace preheated to 650° C. after the casting, which was cooled down to room temperature at 5° C./hour. The glass compositions of comparative examples 1 to 3 were produced similarly. The compositions and properties of the glasses to be used in the scope of the teaching of the present invention according to examples 1 to 16 and the compositions of comparative examples 1 to 3 are summarized in following tables 1 to 4:

TABLE 1

| [in wt.-%] | Example 1 | Example 2 | Example 3 | Example 4 | Example 5 | Example 6 |
|---|---|---|---|---|---|---|
| $SiO_2$ | 52.20 | 52.30 | 52.80 | 55.70 | 56.90 | 53.10 |
| $B_2O_3$ | — | — | — | — | — | — |
| $Al_2O_3$ | 13.00 | 13.00 | 13.40 | 15.00 | 14.10 | 13.70 |
| $Li_2O$ | — | — | — | — | — | — |
| $Na_2O$ | 11.50 | 11.50 | 11.50 | 11.10 | 11.10 | 11.30 |
| $K_2O$ | 2.90 | 2.90 | 3.30 | 4.00 | 4.00 | 3.20 |
| MgO | 2.70 | 2.80 | 2.70 | 3.90 | 4.00 | 3.00 |

TABLE 1-continued

| [in wt.-%] | Example 1 | Example 2 | Example 3 | Example 4 | Example 5 | Example 6 |
|---|---|---|---|---|---|---|
| CaO | 3.90 | 3.70 | 3.80 | 3.00 | 3.50 | 4.20 |
| SrO | — | — | — | — | — | — |
| BaO | 8.70 | 8.70 | 8.40 | 4.50 | 3.50 | 7.50 |
| $ZrO_2$ | 5.00 | 5.00 | 4.00 | 2.50 | 2.50 | 3.70 |
| $TiO_2$ | — | — | — | — | — | — |
| $SO_3$ | — | — | — | 0.20 | 0.20 | 0.20 |
| ZnO | — | — | — | — | — | — |
| F | 0.1 | 0.1 | 0.1 | 0.1 | 0.2 | 0.1 |
| sum | 100.00 | 100.00 | 100.00 | 100.00 | 100.00 | 100.00 |
| alpha | 9.21 | | 9.20 | 8.84 | 8.81 | 9.03 |
| Tg | 603 | | 600 | 615 | 612 | 605 |
| VA | 1123 | | 1120 | 1082 | 1175 | 1130 |
| OEG | n.d. | | n.d. | | | n.d. |
| UEG | n.d. | | n.d. | | | n.d. |
| Kgmax ° C. | n.d. | | n.d. | | | n.d. |
| Kgmax micrometers per minute (µm/min) | n.d. | | n.d. | | | n.d. |
| CaO/MgO | 1.4 | 1.3 | 1.4 | 0.8 | 0.9 | 1.4 |
| sum of MgO + CaO + SrO + BaO | 15.20 | 15.20 | 14.85 | 11.4 | 11 | 14.66 | n.d. = No devitrification measurable (according to the carrier plate method)

TABLE 2

| [in wt.-%] | Example 7 | Example 8 | Example 9 | Example 10 | Example 11 |
|---|---|---|---|---|---|
| $SiO_2$ | 53.50 | 54.50 | 53.90 | 52.70 | 53.10 |
| $B_2O_3$ | — | — | — | — | 0.60 |
| $Al_2O_3$ | 14.00 | 14.30 | 14.50 | 14.50 | 13.70 |
| $Li_2O$ | — | — | — | — | — |
| $Na_2O$ | 11.40 | 11.40 | 11.50 | 11.40 | 11.30 |
| $K_2O$ | 3.30 | 3.50 | 3.30 | 3.20 | 3.20 |
| MgO | 2.90 | 2.90 | 2.70 | 3.20 | 3.00 |
| CaO | 4.10 | 4.10 | 3.80 | 4.50 | 4.20 |
| SrO | — | — | — | — | — |
| BaO | 6.00 | 4.00 | 5.30 | 6.00 | 6.90 |
| $ZrO_2$ | 3.00 | 3.50 | 3.50 | 3.00 | 3.70 |
| $SO_3$ | 0.20 | 0.20 | 0.20 | 0.20 | 0.20 |
| ZnO | 1.50 | 1.50 | 1.20 | 1.20 | — |
| F | 0.1 | 0.1 | 0.1 | 0.1 | 0.1 |
| sum | 100.00 | 100.00 | 100.00 | 100.00 | 100.00 |
| alpha | 9.08 | | 9.06 | | |
| Tg | 597 | | 607 | | |
| VA | 1122 | | 1141 | | |
| OEG | n.d. | | n.d. | | |
| UEG | n.d. | | n.d. | | |
| Kgmax ° C. | n.d. | | n.d. | | |
| Kgmax µm/min | n.d. | | n.d. | | |
| CaO/MgO | 1.4 | 1.4 | 1.4 | 1.4 | 1.4 |
| sum of MgO + CaO + SrO + BaO | 12.99 | 10.99 | 11.78 | 13.68 | 14.06 | n.d. = No devitrification measurable (according to the carrier plate method)

TABLE 3

| [in wt.-%] | Example 12 | Example 13 | Example 14 | Example 15 | Example 16 |
|---|---|---|---|---|---|
| $SiO_2$ | 58.60 | 58.50 | 58.00 | 56.65 | 57.20 |
| $B_2O_3$ | — | — | — | — | — |
| $Al_2O_3$ | 12.60 | 12.85 | 12.60 | 12.50 | 12.80 |

TABLE 3-continued

| [in wt.-%] | Example 12 | Example 13 | Example 14 | Example 15 | Example 16 |
|---|---|---|---|---|---|
| $Li_2O$ | — | — | — | — | — |
| $Na_2O$ | 11.60 | 11.25 | 11.70 | 11.35 | 11.50 |
| $K_2O$ | 3.80 | 4.00 | 3.50 | 3.50 | 3.45 |
| MgO | 3.00 | 3.50 | 3.50 | 3.50 | 3.25 |
| CaO | 2.50 | 2.50 | 2.50 | 2.50 | 2.20 |
| SrO | 4.90 | 4.90 | 4.50 | 6.90 | 6.90 |
| BaO | 0.50 | 0.50 | 0.70 | 0.10 | 0.10 |
| $ZrO_2$ | 2.50 | 2.00 | 3.00 | 3.00 | 2.60 |
| $TiO_2$ | — | — | — | — | — |
| sum | 100.00 | 100.00 | 100.00 | 100.00 | 100.00 |
| alpha | 9.00 | 9.00 | 9.00 | 9.03 | 9.05 |
| Tg | 600 | 600 | 600 | 607 | 603 |
| OEG | n.d. | | | | |
| UEG | n.d. | | | | |
| Kgmax °C. | n.d. | | | | |
| Kgmax μm/min | n.d. | | | | |
| CaO/MgO | 0.8 | 0.7 | 0.7 | 0.7 | 0.7 |
| sum of MgO + CaO + SrO + BaO | 10.9 | 9.9 | 11.2 | 13.0 | 12.45 | n.d. = No devitrification measurable (according to the carrier plate method)

TABLE 4

| [in wt.-%] | Comparative example 1 | Comparative example 2 | Comparative example 3 |
|---|---|---|---|
| $SiO_2$ | 56.90 | 50.90 | 57.8 |
| $B_2O_3$ | — | — | — |
| $Al_2O_3$ | 9.90 | 13.50 | 9.90 |
| $Li_2O$ | — | — | — |
| $Na_2O$ | 11.00 | 10.10 | 11.00 |
| $K_2O$ | 4.20 | 2.50 | 4.20 |
| MgO | 0.50 | 2.50 | 2.50 |
| CaO | 10.90 | 11.00 | 8.00 |
| SrO | — | — | — |
| BaO | — | 8.40 | — |
| $ZrO_2$ | 6.50 | 1.00 | 6.50 |
| $TiO_2$ | — | — | — |
| F | 0.1 | 0.1 | 0.1 |
| Sum | 100.00 | 100.00 | 100.00 |
| Alpha | 9.23 | 9.52 | 9.01 |
| Tg | 620 | 601 | 614 |
| VA | 1100 | 1039 | 1123 |
| OEG | 1160 | 1085 | 1105 |
| UEG | 900 | 925 | 925 |
| Kgmax °C. | 1055 | 995 | 1060 |
| Kgmax μm/min | 5.30 | 5.50 | 2.00 |
| CaO/MgO | 21.8 | 4.4 | 3.2 |
| Sum of MgO + CaO + SrO + BaO | 11.40 | 21.90 | 10.50 |

Alpha = coefficient of thermal expansion at 20 to 300° C. $[\times 10^{-6} K^{-1}]$
Tg = transformation temperature [° C.]
VA = processing temperature, at which the viscosity is $10^4$ dPas [° C.]
OEG = upper devitrification temperature [° C.]
UEG = lower devitrification temperature [° C.]
Kgmax °C. = temperature having maximum crystal growth speed [° C.]
Kgmax = maximum crystal growth speed in [μm/minute]

The devitrification or crystallization behavior was ascertained according to the carrier plate method explained hereafter in the case of rising temperature control.

Carrier Plate Method with Rising Temperature Control:

a) Sample preparation

The sample is pulverized in a mortar and subsequently screened in a sieve to a grain fraction >1.6 mm.

b) Performance

There are two types of carrier plates, using which one or two samples may be tempered simultaneously in a gradient furnace. The plates made of device platinum have conical indentations in two rows offset to one another at a distance of 5 mm each to one another, into which sample pieces of equal size are laid. In the case of glasses of known tendency to crystallize, the furnace is set to 50K above the expected OEG, in the case of unknown glasses, a range having $T_{min} \sim Tg + 50°$ C. is set. The occupied plate is inserted centered into the gradient furnace. A ceramic pin is located as a stop in the rear furnace part in the furnace used.

For tempering in the high-temperature furnace, the plate is brought to the desired insertion depth with the aid of a corundum rod. If a different tempering time is not specified, the plate is first tempered in the furnace for 5 minutes, after half of the time the temperature is read off and written down. Since the temperatures are measured using an external thermocouple element in high-temperature furnaces, the minimum tempering time is 15 minutes, in most cases the samples are tempered for 60 minutes.

Subsequently, the temperature values are plotted on millimeter paper as a function of the furnace length and connected using a curve. After passage of the tempering time, the plate is removed from the furnace, permitted to cool down, and subsequently the sample is microscopically studied for crystallization.

The examples 1, 3, 6, 7, 9 and 12 according to the present invention, in which the crystallization stability was ascertained using the above-described carrier plate method, did not display any devitrification. The devitrification refers in this case to the procedure in which the glass crystallizes out below the transformation range. In comparative examples 1 to 3, in contrast thereto, glasses were obtained which displayed strong tendency to crystallize, since upper and lower devitrification temperatures, a temperature having maximum crystal growth speed, and the maximum crystal growth speed could be specified. The examples and comparative examples therefore prove that the setting of the CaO/MgO ratio in the range according to the invention results in aluminosilicate glasses which are surprisingly crystallization-stable.

Therefore, aluminosilicate glasses specially adapted for the photovoltaic field are provided for the first time by the present invention, which provide an alternative to soda-lime glasses, which have a higher thermal carrying capacity at a Tg>580° C., but display a processing temperature of VA<1200° C., and do not tend toward devitrification, so that the fields of use may be significantly expanded in comparison to soda-lime glasses.

While this invention has been described with respect to at least one embodiment, the present invention can be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains and which fall within the limits of the appended claims.

What is claimed is:

1. A photovoltaic cell, comprising:
a substrate formed from an aluminosilicate glass having a glass composition including:
$SiO_2$;
$Al_2O_3$;
an alkali metal oxide, said alkali metal oxide being $Na_2O$ present in a range between 10 to 16 weight %;
a plurality of alkaline earth oxides including:
a quantity of CaO in a range between >0 to <5 weight %;
MgO, a ratio in weight % of CaO:MgO being in a range between 0.5 to 1.7; and
a quantity of BaO in a range between >1 to 10 weight %.

2. The photovoltaic cell according to claim 1, wherein said glass composition of said aluminosilicate glass includes:
$Na_2O$ in a range of between 10 to 14 weight %;
CaO in a range of between 0.1 to 4.9 weight %; and
BaO in a range of 1.1 to 10 weight %.

3. The photovoltaic cell according to claim 1, wherein said aluminosilicate glass has a transformation temperature >580° C., a processing temperature <1200° C., and a coefficient of thermal expansion in a range of 8.5 to 10 ×10$^{-6}$/K in a temperature range of 20 to 300° C.

4. The photovoltaic cell according to claim 1, wherein the photovoltaic cell is a thin-film photovoltaic cell.

5. The photovoltaic cell according to claim 4, wherein said quantity of MgO in said aluminosilicate glass is in a range between >0 to 6 weight %.

6. The photovoltaic cell according to claim 4, wherein a quotient in weight % of CaO:MgO in said aluminosilicate glass is in a range of between 0.8 to 1.6.

7. The photovoltaic cell according to claim 4, said aluminosilicate glass further comprising SrO, a sum of MgO+CaO+SrO+BaO in said aluminosilicate glass being in a range of between 7 to 18 weight %.

8. The photovoltaic cell according to claim 4, wherein said aluminosilicate glass has a glass composition in weight % on an oxide basis comprising:
$SiO_2$ 49-69 weight %;
$B_2O_3$ 0-2 weight %;
$Al_2O_3$ >4.7-15.5 weight %:
$Li_2O$ 0-4 weight %;
$Na_2O$ 10-16 weight %;
$K_2O$ >0-8 weight %;
a sum of $Li_2O+Na_2O+K_2O$ >12-19 weight %;
MgO >0-6 weight %;
CaO >0- <5 weight %;
SrO 0-8 weight %;
BaO >1-10 weight %;
a sum of MgO+CaO+SrO+BaO 7-16 weight %;
F 0-3 weight %;
$TiO_2$ 0-6 weight %;
$Fe_2O_3$ 0-0.5 weight %;
ZrO2 >0-6 weight %;
a sum of $BaO+ZrO_2$ 4-15 weight %;
ZnO 0-5 weight %;
$CeO_2$ 0-2 weight %;
$WO_3$ 0-3 weight %;
$Bi_2O_3$ 0-3 weight %;
$MoO_3$ 0-3 weight %; and
said ratio in weight % of CaO:MgO being in a range between 0.5 to 1.7.

9. The photovoltaic cell according to claim 8, wherein said glass composition of said aluminosilicate glass in weight % on an oxide basis comprises:
$B_2O_3$ 0 weight %;
$Al_2O_3$ in a range between 9-15.5 weight %;
$Li_2O$ 0-<0.3 weight %;
$K_2O$ in a range between >0- <5 weight %;
MgO >2-5.5 weight %;
CaO 2-<5 weight %;
SrO in a range between 0-5 weight %;
BaO in a range between 1.1-9 weight %;
F >0-0.3 weight %;
TiO2 >0.1-5 weight %;
ZrO2 in a range between 1-6 weight %;
said sum of $BaO+ZrO_2$ 5-15 weight %; and
ZnO 0.5-3 weight %.

10. The photovoltaic cell according to claim 1, wherein said aluminosilicate glass has a glass composition in weight % on an oxide basis comprising:
$SiO_2$ 48-58 weight %;
$B_2O_3$ 0-1 weight %;
$Al_2O_3$ 12-16 weight %;
$Li_2O$ 0-1 weight %;
$Na_2O$ 10-14 weight %;
$K_2O$ 1-5 weight %;
a sum of $Li_2O+Na_2O+K_2O$ 11-17 weight %;
MgO 1.5-6 weight %;
CaO 3-4.5 weight %;
SrO 0-3 weight %;
BaO 3-10 weight %;
a sum of MgO+CaO+SrO+BaO 7-18 weight %;
F 0-3 weight %;
$TiO_2$ 0-3 weight %;
$Fe_2O_3$ 0-0.5 weight %;
$ZrO_2$ >0-7 weight %;
a sum of $BaO+ZrO_2$ 8-15 weight %;
ZnO 0-5 weight %;
$CeO_2$ 0-2 weight %;
$WO_3$ 0-3 weight %;
$Bi_2O_3$ 0-3 weight %;
$MoO_3$ 0-3 weight %; and
said ratio in weight % of CaO:MgO being in a range between 0.5 to 1.7.

11. The photovoltaic cell according to claim 10, wherein said aluminosilicate glass has a glass composition in weight % on an oxide basis comprising:
$B_2O_3$ 0 weight %;
$Al_2O_3$ >12-15 weight %;
$Li_2O$ 0-<0.3 weight %;
$K_2O$ 2-4 weight %;
CaO 3-<4.5 weight %;
SrO 0-<0.5 weight %;
BaO in a range between 4-9.5 weight %;
said sum of MgO+CaO+SrO+BaO 12-17 weight %;
F >0-1 weight %;
$TiO_2$ in a range of between 0-2 weight %;
ZrO2 in a range of between 1-6 weight %;
said sum of $BaO+ZrO_2$ in a range of between 10-15 weight %; and
ZnO 0.5-2 weight %.

12. The photovoltaic cell according to claim 1, wherein said substrate is formed as a tubular glass enclosed by a protective tube, said protective tube being an outer tube.

13. The photovoltaic cell according to claim 12, wherein said substrate formed as said tubular glass is an inner tube formed of said aluminosilicate glass.

14. The photovoltaic cell according to claim 13, wherein said outer tube is formed from said aluminosilicate glass.

* * * * *